(12) United States Patent
Doll et al.

(10) Patent No.: US 8,647,526 B2
(45) Date of Patent: Feb. 11, 2014

(54) TWO COMPONENT ETCHING

(75) Inventors: Oliver Doll, Dietzenbach (DE); Edward Plummer, Muenster (DE); Mark James, Romsey (GB); Ingo Koehler, Reinheim (DE)

(73) Assignee: Merck Patent Gesellschaft mit Beschrankter Haftung, Darmstadt (DE)

( * ) Notice: Subject to any disclaimer, the term of this patent is extended or adjusted under 35 U.S.C. 154(b) by 68 days.

(21) Appl. No.: 13/375,812

(22) PCT Filed: May 12, 2010

(86) PCT No.: PCT/EP2010/002949
§ 371 (c)(1),
(2), (4) Date: Dec. 2, 2011

(87) PCT Pub. No.: WO2010/139390
PCT Pub. Date: Dec. 9, 2010

(65) Prior Publication Data
US 2012/0085965 A1  Apr. 12, 2012

(30) Foreign Application Priority Data
Jun. 4, 2009 (EP) ..................................... 09007411

(51) Int. Cl.
*C09K 13/04* (2006.01)
*B44C 1/22* (2006.01)

(52) U.S. Cl.
USPC ....... 252/79.2; 252/79.1; 252/79.3; 252/79.4; 216/83; 216/96; 216/99

(58) Field of Classification Search
USPC .......... 252/79.1, 79.2, 79.3, 79.4; 216/83, 96, 216/99
See application file for complete search history.

(56) References Cited

U.S. PATENT DOCUMENTS

| | | | | | |
|---|---|---|---|---|---|
| 3,979,241 | A | * | 9/1976 | Maeda et al. | 438/637 |
| 4,781,792 | A | * | 11/1988 | Hogan | 216/36 |
| 5,698,503 | A | | 12/1997 | Ward et al. | |
| 7,431,860 | B2 | * | 10/2008 | Kawase | 216/83 |
| 8,133,937 | B2 | * | 3/2012 | Ward et al. | 523/160 |
| 2005/0196671 | A1 | | 9/2005 | Paonessa et al. | |
| 2006/0263606 | A1 | | 11/2006 | Aberle et al. | |
| 2008/0121621 | A1 | * | 5/2008 | Stockum et al. | 216/97 |
| 2008/0311492 | A1 | * | 12/2008 | Iftime et al. | 430/19 |

FOREIGN PATENT DOCUMENTS

| | | |
|---|---|---|
| KR | 10-0812891 B1 | 3/2008 |
| WO | 97/02958 A1 | 1/1997 |
| WO | 2004/089841 A1 | 10/2004 |

OTHER PUBLICATIONS

International Search Report, dated Nov. 4, 2010, issued in corresponding PCT/EP2010/002949.

* cited by examiner

*Primary Examiner* — Shamim Ahmed
(74) *Attorney, Agent, or Firm* — Millen, White, Zelano & Branigan, P.C.

(57) ABSTRACT

The object of the present invention is a new inkjet printable etching composition comprising an etchant, which is activated by a second component. Thus, a further object is the use of this new composition in a process for the etching of surfaces semiconductor devices or surfaces of solar cell devices.

21 Claims, 1 Drawing Sheet

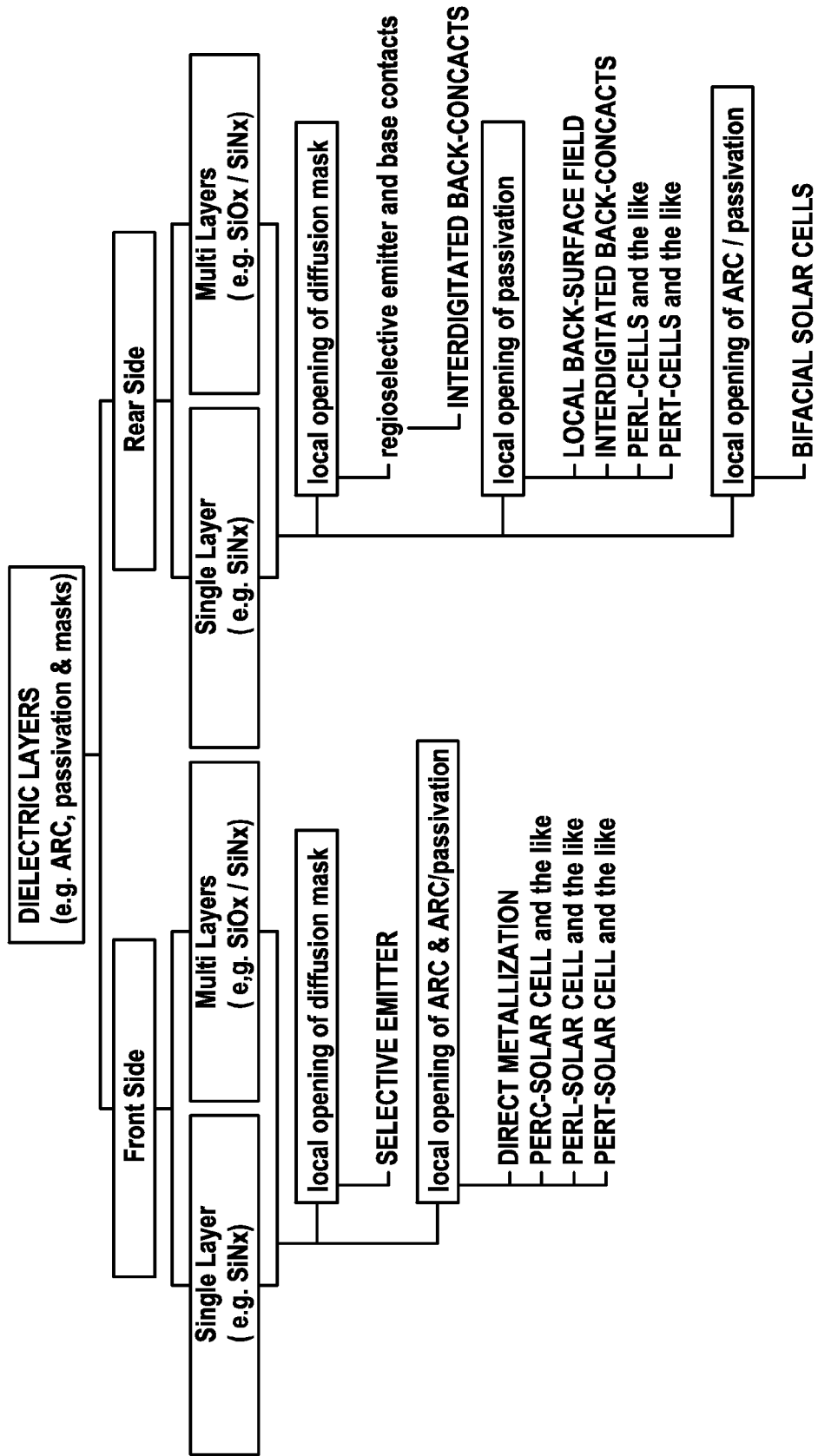

TWO COMPONENT ETCHING

The object of the present invention is a new inkjet printable etching composition comprising an etchant, which is activated by a second component. Thus, a further object is the use of this new composition in a process for the etching of surfaces of semiconductor devices or surfaces of solar cell devices.

In WO 2004/089841 researchers of UNISEARCH Ltd. (The University of New South Wales) are using a two component approach for etching $SiO_2$. An acidic polymeric layer is spun coated onto the substrate. Then the pattern, that is required to be etched, is printed by inkjet printing using a neutral fluoride based material.

The invention targets a method for contactless deposition of novel formulations of etchants onto semiconductor device surfaces as well as consecutive etching of functional layers being located on top of these devices. Above-mentioned functional layers may either serve for the purpose as surface passivation layers and/or anti-reflective coatings (ARCs).

Unfortunately the method disclosed by UNSW [UNISEARCH Ltd. (The University of New South Wales)] requires that the fluoride must be applied for more than 50 times by inkjet printing in the same region in order to obtain enough material to be able to etch to the desired depth.

Surface passivation layers for semiconductors mostly comprise the use of silicon dioxide ($SiO_2$) and silicon nitride ($SiN_x$) as well as stacks composed of alternating layers of silicon dioxide and silicon nitride, commonly known as NO- and ONO-stacks. The surface passivation layers may be brought onto the semiconductor using well-known state-of-the-art deposition technologies as chemical vapour deposition (CVD), plasma-enhanced chemical vapour deposition (PECVD), sputtering, as well as thermal treatment in course of the exposure of semiconductors to an atmosphere comprising distinct gases and/or mixtures thereof. Thermal treatment may comprise in more detail methods like "dry" and "wet" oxidation of silicon as well as nitridation of silicon oxide and vice versa oxidation of silicon nitride.

Anti-reflective layers are typical parts of state-of-the-art solar cells serving for an increase of the conversion efficiency of solar cells induced by achieving an improved capability to trap the incident light within the solar cell (optical confinement).

Innovative solar cell concepts often require that either surface passivation or anti-reflective layers have to be opened locally in order to build up certain structural features and/or to define regions bearing different electronic and electrical properties. Commonly, such layers may be structured by local deposition of etching pastes (EP 1 276 701), by photolithography, by depositing a "positive" mask of common etch resists, whereby in the latter case the deposition method may be either screen-printing or ink jetting, as well as laser-induced local ablation of the material. Each of the above-mentioned technologies offer unique advantages, however, they also suffer due to unique drawbacks. For instance, photolithography enables smallest feature sizes combined with a degree of very high accuracy. However, it is a time consuming process technology making it therefore very expensive and as a consequence of that it will be not applicable for the need of industrial high volume and high throughput manufacturing, in particular with respect for the specific needs of crystalline silicon solar cell production. Surface structuring by laser ablation bears the drawback of local laser-induced surface damage during dissipation of heat brought in by laser light. As a consequence, the surface becomes altered by melting and re-crystallization processes which may significantly affect the surface morphology, e.g. by locally destroying surface textures locally. Besides latter undesirable effect, the surface has to be liberated from the laser-induced surface damage which is most commonly achieved by a wet-chemical post-laser treatment, for instance by etching with solutions comprising KOH and/or other alkaline etchants. On the other hand, deposition of material by ink jetting is by a first approach a strongly locally limited technique of deposition. Its resolution is somewhat better than that of screen-printing. However, the resolution is strongly influenced by the diameter of the droplets jetted from the print head. For instance, a droplet with a volume of 10 pl results in a droplet diameter of about 30 µm, which may spread on the surface when hitting it by an interaction of impact related deceleration and surface wetting. One of the striking benefits of ink jetting is, besides contactless deposition of functional materials, local deposition in combination with a low consumption of process chemicals. In principal, any kind of complex layout may be printed onto surfaces by just involving computer-aided designs (CAD) and transferring the digitalized print layout to the printer and the substrate, respectively. Another benefit of ink jet printing is in comparison to photolithography the tremendous potential for cutting down of essential process steps needed for surface structuring. Ink jetting comprises three major process steps only, whereas photolithography affords at least eight of those. The main three steps are: a) deposition of ink, b) etching and c) cleaning of the substrate.

The present invention is related to local structuring of photovoltaic devices. However it is not only limited to this field of application. In general, manufacturing of electronic devices in general requires the structuring of any kind of surface layers. Typical layers on the surfaces comprise besides of other types silicon oxides and silicon nitrides. For the structuring of these layers by ink jet printing suitable etching compositions are needed and ink jet systems, which are compatible with chemicals used for the etching process, namely the print head, must be either manufactured of materials being compatible with typical chemicals used for the etching of silicon dioxide and/or silicon nitride or the ink must be formulated to be chemically inert at ambient and slightly elevated temperatures (for instance at 80° C.), thus evolving its etching capability on the heated substrate only.

In order to etch through silicon nitride/oxide films an inkjet printable fluoride based etchant is used.

Inkjet printing is a favourable technique for depositing these materials because:
- it is a non-contact method, and therefore it is advantageous for patterning fragile substrates.
- as a digital technique images can be easily manipulated and a printer can be used for rapidly printing a range of different patterns.
- it is useful to provide better resolution than screen printing and it is a fast method too.
- it is efficient in the use of material, financial and environmental impacts.

There are two critical hurdles, which have to be overcome, if structuring shall be made by inkjet printing of etchants, which are based on acidic fluoride solutions:
 a) precisely jetting the ink onto the surface and
 b) ensuring that an effective etching takes place.

Jetting the Inks:
  The inks must be compatible with the print head; simple acidic fluoride etchants may not be dispensed through the majority of print heads, which are available commercially, because their construction is mainly made of silicon and metallic components and which are corroded by acidic fluorides.

The physical properties of the inks such as surface tension, viscosity and viscoelasticity must fulfil the requirements for ink jet printing.

The Etching Process:

The etchants must be suitable to be applied in small volumes, because the influence of process conditions, like elevated temperatures, lead to a rise of the concentration of the etching compounds and this has not to have a disadvantageous effect on the etching process.

The etchants have to be suitable to etch under conditions, that are compatible with other materials of the device or of the solar cell (i.e not significantly etch silicon).

The ink must be composed such that it may be positioned onto the surface to be etched and that it interacts physically with the surface. Out of this reason surface energies and tensions of the ink must be adapted and balanced along with the ink viscosity.

The etchants have to be free of elements like metal cations, which would lead to an undesired doping and contamination of the treated surface.

Etching compositions and reaction products must be easily removable in a subsequent rinsing step.

In some applications the etching step must lead to a uniform depth across the pattern.

Thus it is an object of the present invention to provide a suitable ink composition which is compatible with the print head. Especially it is an object of the present invention to provide such compositions, which are compatible with the print head although they comprise fluoride.

In theory there are different approaches to obtain compositions wherein HF is the active etchant at the substrate surface, which is formed from an inkjet printable ink:

1) Single deposition approach: An etchant is printed onto the substrate surface, where it can be activated either thermally, photochemically or by reaction with an activating agent, which is contained in the ink solution or in the gas phase.

2) Double deposition approach: According to this approach in a first step an inactive etchant is deposited onto the substrate surface and in a second step an activating agent, like a catalyst or an initiator, is applied by inkjet printing.

3) Double deposition approach using acid/base chemistry: In a third approach an acid is printed onto a fluoride containing spin coated film or onto inkjet printed tracks or lines.

Unexpectedly our experiments have shown, that these methods are suitable to solve problems caused by ink compositions, which are incompatible with the inkjet head. According to these approaches it may be ensured that when inks pass through the inkjet head they have little or no etching capability. But when they are in place on the substrate they may be activated for the etching step.

DETAILED DESCRIPTION OF THE INVENTION

As characterized according to item 1) in this procedure the effective etchant is generated by a thermal and/or photochemical step or by bulk exposure to a solution of an activating agent.

Unfortunately this procedure is associated with a loss of a certain amount of the basic component caused by evaporation.

Basic HF salts such as $NH_4F$ and $R_3NHF$ have only weak etching capability. Amine cations, which have a low molecular weight, are in equilibrium with their acid base components (for example: $NH_4F$ with $NH_3$ and HF). Applying the ink onto a substrate by ink-jetting and subsequently heating results in a raise of the vapour pressure of the basic component and it evaporates. This process leads to an acidic fluoride environment on the substrate surface which is then etched. Basic fluoride salts with moieties having a high vapour pressure, like amine, include $NH_4F$, $Me_3NHF$, $Et_3NHF$, $i\text{-}Pr_2NH_2F$ and the like may be applied. These compounds can be characterized by the general formula $R^1R^2R^3NHF$, wherein $R^1$, $R^2$, $R^3$ may be any hydrocarbon group including a proton. Moreover compounds characterized by the general formula $R^1R^2R^3NR^4F$ are suitable, wherein $R^1$, $R^2$, $R^3$ and $R^4$ may be any hydrocarbon group on condition that the basic compound shows a suitable vapour pressure.

In general the inkjet printable composition comprises the fluoride ion generating compound in a concentration in the range of about 5 to 25% by weight.

An example for a suitable and inkjet printable composition is an ink containing 20% by weight of $Et_3NHF$ and 10% by weight of PEG in water.

Another approach is the etching at high temperatures with non acidic fluoride compounds.

High temperatures (100° C. up to 400° C.) can be applied to accelerate the etching reaction of silicon nitride or silicon oxide with non-acidic fluoride sources. Fluoride sources, such as KF, are effective etchants (wherein potassium may be replaced by any metal fluoride) in the presence of humectants such as glycerol.

A typical ink, that is inkjet printable, comprises about 20% by weight of KF and glycerol and water, having a reduced viscosity at a inkjet printable level. Polyvalent alcohols can be added in order to increase the viscosity of the composition, which is effective on the substrate. Suitable polyvalent alcohols are selected from the group glycerol, ethylene chlorohydrin, dioxane pinacol, or ethylene glycol mono methyl ether. These alcohols may be contained as such or mixtures thereof. Where applicable also polyethylene glycol and polymethylene glycol may be added in order to adjust the viscosity. In general, the alcohols show boiling points higher than 100° C. Alcohols which are solid at room temperature show melting points of less than 200° C. to 300° C. and are all chemically stable at the boiling point or melting point.

The comprising non acidic fluoride compounds release fluoride during thermal treatment.

Especially, if these sources are held in an acidic environment on thermolysis conditions at elevated temperatures fluoride ions are set free, which are a source of HF, the active etchant. Preferred fluoride containing compounds, which are suitable for this approach, are selected from the group ammonium tetrafluoroborate, tetrafluoroboric acid, Selectafluor (1-Chloromethyl-4-fluoro-1,4-diazoniabicyclo[2.2.2]octane bis(tetrafluoroborate)) and organic acid fluorides such as benzyl fluoride.

A typical ink as described, which is applied by inkjet printing, comprises for example $HBF_4$ in an amount in the range of about 20% by weight in water in combination with for example a thermally inert binder like polyethylene glycol, which decreases the mobility of the ink on the substrate. Treatment of $HBF_4$ at elevated temperatures leads to its decomposition and HF is set free, which is the active etchant.

Another approach, which is also an object of the present invention, is characterized in a thermal release of protons. The released protons induce the building of HF.

Compounds such as N-Sulfonyloxyimides, Oxime Sulfonates, ammonium sulphonates and benzoin tosylate are able to release protons at elevated temperatures. Ink compositions comprising compounds selected from this group in combination with an uncharged compound, which may serve as a fluoride ion source, may be activated thermally releasing HF, the active etching agent.

A typical ink that maybe inkjet printed consists of about 15 percent by weight of 2-nitrobenzene tosylate and about 10 percent by weight of Lithium fluoride in diglyme. This composition is completed by the addition of water in order to adjust the viscosity below 20 cP.

In a further embodiment of the invention the composition may comprise compounds, which dissociate in a photochemical reaction and release protons.

Compounds such as diphenyliodonium salts release protons under irradiation with light. This means, that inks comprising so-called "photoacids" in combination with neutral fluoride ion sources generate the effective etching agents by irradiation.

Photoacids are weak Brønsted acids in their electronic ground state. Upon optical excitation, photoacids become strong Brønsted acids and readily dissociate in aqueous solutions. Hydroxyarenes are the most well-researched photoacids. Among the hydroxyarenes, 1-naphthol and 2-naphthol have been extensively studied in the past 60 years.

A typical ink composition belonging to the group comprising photoacids may consist of about 20 percent by weight of diphenyliodonium fluoride and 5 percent by weight of PVP and water.

In another embodiment of the invention fluoride may be released photochemically.

Use of UV light for direct photolysis of precursors, containing non ionic covalently bound fluoride, in acidic media is known to someone skilled in the art. The fluoride ions are released into an acidic environment building HF, which is then available for the etching of the substrate surface.

A suitable ink, which is inkjet printable, may consist of about 20 percent by weight of fluoroacetone, serving as a fluoride source in presence of an acid like phosphoric acid. This material is then printed onto the surface to be etched and irradiated with ultraviolet light in order to release fluoride and to generate HF, which then etches the surface.

A further embodiment of the present invention is the exposure of the bulk of the printed ink to a second solution comprising an activating agent.

In general according to the present invention a composition comprising neutral or basic fluoride containing compounds and a suitable binder has to be inkjet printed onto a substrate to be etched. In a second step the surface showing the printed etching composition has to be exposed to an acid vapour or gas or to an acidic solution in order to generate HF at the substrate surface as the active etchant. Thus etching only occurs at areas where for example the KF comprising mixture has been deposited.

A suitable ink composition that can be inkjet printed consists of about 10 percent by weight of KF in an aqueous PVP solution (5%). After patterning the surface in an inkjet process, and drying, the substrate is exposed to an atmosphere of HCl in order to generate HF at the substrate surface.

In an alternative process an ink is formulated containing
a component, that reacts with an external reactant, like water, generating an acid,
a source of fluoride, such as NaF or another fluoride salt, an acid anhydride
and optionally a suitable anhydrous solvent.

On hydrolysis of the anhydride protons are released giving a source of HF, that may etch the substrate.

A typical ink that can be inkjet printed consists of about 5 percent by weight of KF and of about 5 percent by weight of low molecular poly acetic anhydride in dry glycerol. This composition is then inkjet printed onto the substrate surface and exposed to a humid atmosphere. On hydrolysing the anhydride component a carboxylic acid functionality is formed, which leads in combination with free fluoride ions to the building of HF which etches the substrate.

In general according to the present invention and the single deposition approaches in particular, the deposition of the ink be facilitated by so-called concept of bank structures. Bank structures are features on the surface which form canal-like arrays where the inks may be easily deposited. The ink deposition is facilitated by surface energy interactions providing both, the ink and the bank materials opposite, expelling characteristics, so that the ink is forced to fill up the channels defined by bank materials without wetting the banks itself. If desirable, the bank material may possess boiling points higher than those required for the etching process itself. After completion of the etching process, the banks may easily rinsed off by appropriate cleaning agents or alternatively the substrate is heated up until the banks have completely evaporated. Typical bank materials are selected from the group of following compounds and/or of their mixtures: nonylphenol, menthol, α-terpeniol, octanoic acid, stearic acid, benzoic acid, docosane, pentamethylbenzene, tetrahydro-1-naphthol, dodecanol and the like as well as photolithographic resists, polymers like polyhydrocarbons, for example $(CH_2CH_2)_n$—, polystyrene etc. and other types of polymers.

In addition to this a double deposition is also an option to obtain the effective etchant. In a preferred embodiment this approach is characterized by a catalytic release of fluoride ions.

Compounds such as benzene sulphonyl fluorides can be catalysed to release fluoride ions by carboxylates. In a first process step sulphonyl fluorides can be inkjet printed or spin coated onto a substrate surface. Subsequently a carboxylate comprising composition may be applied using inkjet printing. When the two components come together at the surface the releases of bound fluoride is triggered into free fluoride ions and in an acidic environment HF is available and will act as an etchant.

A typical ink that maybe inkjet printed consists of about 10 weight percent of toluene sulphonyl fluoride in an aqueous solution comprising about 5 percent weight of low molecular poly ethylene glycol. A suitable inkjet printable catalyst containing ink for developing the active etchant is an aqueous solution of about 20 percent by weight of potassium acetate.

In a further embodiment of the approach of double deposition of complementary compositions for the generation of the active etchant may be fulfilled by acid/base chemistry.

Non acidic fluoride sources may be combined at the substrate surface with compounds serving as sources of acids. This may be fulfilled either by consecutive inkjet applications or by the application of the first component via spin coating and then patterning with the second component using an inkjet printing process.

Preferably for the spin coating a fluoride containing material is used and then in an inkjet printing step an acid is applied.

Suitable spin coatable fluoride sources for the preparation of the spin coated layer may include an electrolyte carrying polymers with alkali metal fluorides, HF salts of amines including ammonia, trialkyl amines, tetraalkylammonium fluorides and polymeric amines and nitrogen heterocycles such as poly allylamine and poly vinylpyridine.

In an alternative process sequence an acidic polymer for example comprising polyacryl and/or polystyrene sulfonic acids may be for instance spin coated, flexo printed, slit coated or roller coated onto wafer's surface, dried and subsequently seeded by a solid source of fluoride, such as NaF, KF, $NH_4F$, $NH_4HF_2$ and the like. Seeding of tracks or other geometrical features of fluoride may be for instance easily and deliberately accomplished by aerosol printing. In a proceeding step, water and other protic solvents or mixtures thereof are jetted to the fluoride tracks in order to trigger the etching reaction to take place.

In the following inkjet printing step of the acidic components the inkjet printable acids may be selected from the group consisting of acetic acid and other organic acids, mineral acids, like phosphoric acid (85%) and others either in pure form or mixtures thereof. Compositions according to the present invention may be applied in high concentrations and inkjet printed at high density.

An approach in which the fluoride containing material is spin coated at high concentration and then an acid is inkjet printed on top in order to pattern the substrate results in a high reduction of the number of printing passes which are required to etch completely to a desired depth. This advantage arises from the fact that a higher molar content of protons over fluoride ions can be inkjet printed. This also reduces the volume of material that is required and has to be inkjet printed in order to be able to etch to a desired depth.

In another embodiment of the present invention an acidic structure is inkjet printed and subsequently the fluoride source is applied by a further inkjet printing.

One desirable feature of this process is to have the first printed pattern 'capture' the second ink application. This can be achieved by having the first pattern solidified after printing with a large coffee staining effect in order to retain the next ink, which due to the retaining structure can be applied in liquid form. In this case it is desirable to incorporate a binder into the ink used for the first pattern, which comprises the active components, such that it gets a defined physical form.

In general, for carrying out a structuring according to this procedure inkjet printable acids are preferably selected from the group of poly acids, such as polystyrene sulphonic acid, poly acetic acid, but also from the group consisting of concentrated acetic acid or other organic acids, phosphoric acid and other mineral acids. These acids may be added either in pure form or as mixtures thereof. The acids may be mixed with other non acidic electrolyte supporting polymers, such as PEG, PVP, to retain the printed structures. Polar solvents such as ethers, alcohols and water are suitable carrier solvents.

The fluoride comprising component may contain alkali metal fluorides, HF salts of amines including ammonia, trialkyl ammines, tetraalkylamine fluorides, di and mono alkyl amines, and polymeric amines and nitrogen heterocycles such as poly allylamine and poly vinylpyridine as such or mixtures thereof. Polar solvents like ethers, alcohols and water are suitable carrier solvents.

In a further embodiment of the present invention a fluoride source is inkjet printed and the acid comprising ink is printed.

This concept is very similar to printing an acid containing ink onto a fluoride source containing first layer, but the formulation is varied to ensure that the fluoride source, which is deposited initially, remains fixed, even when the acid is printed onto it.

In this case suitable fluoride components are selected from the group of alkali metal fluorides, HF salts of amines including ammonia, trialkyl ammines, di and mono alkyl amines, and polymeric amines, polymers of nitrogen heterocycles such as poly allylamine and poly vinylpyridine. Applicable compositions will include binders in order to adjust an increased viscosity or to induce a solidification of the printed composition by evaporation the containing carrier solvents, whereby the printed pattern is fixed. Polar solvents such as ethers, alcohols and water are suitable carrier solvents.

As well as the compositions described previously these compositions may comprise further acid components. Suitable acids that may be contained and applied by inkjet printing with are selected from the group of concentrated acetic acid or comparable organic acids, phosphoric acid and other mineral acids either in pure form or mixtures thereof. Additionally the compositions may comprise polar solvents selected from the group of ethers, alcohols and water as such or mixtures thereof as solvents No matter which of these embodiments of the present invention is put into practise all inks have to have optimized compositions, wherein the different compounds interact as desired among each other but also with the surfaces, which have to be etched and structured.

In this context solvents and solvent mixtures can be used to adjust the physical properties of the inks such as viscosity and surface tension. Suitable solvents for dissolving ionic etchants are alcohols and high boiling point ethers, poly ethers, other polar solvents such as DMSO, DMF. Polar solvents are preferred because they are suitable to improve the dissolution of polar etching products and react as humectants retaining water which accelerates the etching reaction.

As mentioned above the ink compositions have to be compatible with the materials of the inkjet print head and the printed inks have to be composed of mixtures which are not corrosive for the print head. Therefore, preferably etching compositions are chosen, which are inactive during printing and have no etching properties when they pass through the print head. For example, if a one component ink is used according to the present invention, it comprises a neutral (uncharged) or a basic fluoride.

But in return the print heads have also to be compatible with the used ink compositions.

If one component or neutral (uncharged) or basic fluoride compositions are applied, printing can be carried out continuously or in a drop on demand (DOD) mode. For these printing modes, preferably for the DOD mode the print head can be chosen as thermal, piezo, electrostatic, MEMS inkjet head. Preferably for the DOD mode piezo or electrostatic print heads are used. Suitable heads are for example FujiFilm Dimatix SX3 head, SE and SE3 heads, DMP 1 or 10 pl IJ heads, Xaar Onmidot, HSS, Trident 256 jet and the like. Most preferred are high accuracy types, which are designed for high precision micro deposition which may incorporate drive per nozzle technology like the FujiFilm Dimatix SX3 and SE3 head and Konica Minolta DPN head.

For printing inks, having immediate etching capability, may be printed with the polymeric Konica Minolta DPN head, 256 or 512 heads.

One of the most important parameter influencing the desired etching result is the interactions between the printed ink and the substrate, which has to be patterned.

By controlling the interaction between the ink and the substrate the accuracy of the etched pattern is determined. In case of depositing an etchant this interaction varies with time as the substrate is modified by the etching process. Therefore it is crucial to be able to control this interaction through out the entire procedure. As such this can be made by different methods.

Experiments have shown that it is possible to control and to tune the interaction between the substrate surface and the applied ink. A number of methods are described and listed below.

In order to generate a proper pattern the physical properties of the applied inks are most decisive among other influencing variables.

Good etching results are achieved with ink compositions showing surface tensions preferably in the range of >20 dyne/cm and <60 dyne/cm, more preferably in the range of >25 dyne/cm and <50 dyne/cm and most preferably in the range of >28 dyne/cm and <40 dyne/cm.

Suitable inks are preferably filtered to less than 1 micron and more preferably to less than 0.5 micron, in order to be able to print very narrow lines and small patterns and to avoid a clogging of the print head.

The viscosity of the ink formulation has to be in the range of >2 cps and <20 cps at the jetting temperature.

The jetting of the inks may be carried out at room temperature to about 300° C., preferably it is carried out at a temperature in the range of room temperature to about 150° C. and most preferably in the range of room temperature to about 70° C.

The surface tension of the applied inks can be influenced and, if needed, reduced by the addition of components like surfactants or for example of low surface tension co-solvents, and inclusive fluorinated solvents.

In order to fix the etchant during drying and to define the area of etching more accurately the addition of binders is advisable.

Thus, thermally and photochemically cross linkable binders maybe added to fix the ink on the substrate.

The ink may be a 'hot melt' type, which is for example liquid at jetting temperature but solid at room temperature. Hot melt inks are used to fix the etchant on the surface and to define the area of etching more accurately.

Different carrier solvents or mixtures of solvents can be used to compose the ink formulation, thus influencing the kinetics of drying and the change of viscosity, and thereby influencing the form of the printed structures with the effect, that highly coffee stained features may be programmed and secondary depositions of ink may be avoided.

Beyond these methods to influence the interaction between the treated surfaces and the applied ink is the possibility to modify the physical properties of substrates itself.

Thus, pre-defined structures by applying banking materials may be prepared (e.g. by IJ of a hydrophobic polymer, using photo-lithography) and hydrophobic/hydrophilic areas may be applied onto the substrate (e.g. using photo-lithography)

A further option is to change the total surface energy (either hydrophobic or hydrophilic) for example by plasma treatment, or applying surfactants or other surface treatments.

The interaction is also changed, if the printing takes place on heated or cooled substrate surfaces. Simultaneously the drying or etching characteristics of the ink is changed and the etching result may be influenced as desired.

In a particular embodiment of the present invention the wet inkjet film can be dried at elevated temperatures whereby the etchant is fixed.

Target Materials

Apart from the above-mentioned object of the present invention, in particular it is not only the aim to structure of SiNx-layers, but also the structuring of the following layers is targeted:

$SiN_x$ for the purpose of antireflective layers, especially for solar cells, but not restricted hereto $SiN_x$ for the purpose of surface passivation of semiconducting materials, but not restricted hereto $SiO_x$ for the purpose of surface passivation of semiconducting materials, but not restricted hereto $SiO_x$ as a masking material for manufacturing and structuring of semiconductors, e.g. solar cells in particular, but not restricted hereto $TiO_x$ as antireflective coatings for the manufacturing of solar cells, but not restricted hereto $Al_xO_y$ and/or substoichiometric low temperature surface passivation of semiconductiong materials by for instance ALD-deposited aluminium oxide, but not restricted hereto TaN and TiN for the purpose of diffusion barriers, but not restricted hereto Metals, like for instance Al, for the purpose of device metallization, but not restricted hereto.

The structuring of such layers is of growing interest not only in the field of solar cell manufacturing, but also in other technical fields where thin layers as described appear and have to be structured as for example during display production, especially in any kind of touch screen panel manufacturing, but also in the course of electronic-, micro-electronic and/or MEMS-device manufacturing.

Target Devices Processes

The materials as well as layer stacks mentioned under preceding paragraph, however, not limited to those explicitly mentioned over-there, may be applied during the manufacture of either standard or conventional solar cell as well as for advanced, so-called high-efficiency, devices. Under the term "standard solar cell", devices are meant, which comprise features which are shown in FIG. 1

FIG. 1 shows a simplified flow chart demonstrating necessity of structuring of dielectric layers for the manufacturing of advanced solar cell devices.

Textured front and rear side; under certain circumstances, flat and polished rear sides, thus surfaces deliberated from specific texture topographies, may be beneficial The emitter is located on/in the front side being mostly wrapped around the edges of the solar cells The emitter is mostly capped by $SiN_x$-layer originating from PECVD-deposition, this layer serves as surface passivation besides being responsible for reflectance reduction of the device (ARC).

On top of the ARC, virtually, metal contacts are formed somehow, mostly by thick film deposition, in order to enable charge carriers to leave device for traversing exterior circuitry after their penetration through the ARC layer.

The rear side is mostly characterized by residual n-doped layer as well as by a less precisely defined layer stack of Al-alloyed silicon, Si-alloyed aluminium as well as sintered aluminium flakes, whereby the latter stack of layers serve as so-called back-surface field (full BSF) as well as rear electrode.

The solar cell device is completed by something called denoted as edge isolation which serves for disconnecting front side exposed emitter from rear side carrying electrode by wipe out of ohmic shunt. This shunt elimination may be achieved by different process technologies having a direct impact on above mentioned general description of solar cells architecture, thus aforesketched device description is prone to process variations.

The manufacture of state of the art or just above-depicted "standard" solar cells omit the need of two dimensional processes of (surface) structuring. Advances for obtaining significant benefits in conversion efficiencies of solar devices, however, express urgent needs for structuring process in general. approaches for solar cells whose architectures are inherent for structuring steps, however not limited to those subsequently mentioned, are:

1. Selective emitter solar cells, comprising a
   a) One-step selective emitter or
   b) Two-step selective emitter
2. Solar cells being metallized by a "direct metal approach" or "direct metallization"
3. Solar cells with a local back-surface field
4. PERL-solar cells (passivated emitter rear locally diffused)
5. PERC-solar cells (passivated emitter rear contact)
6. PERT (passivated emitter rear totally diffused)
7. Interdigitated back contact cells
8. Bifacial Solar Cells In the following context, only brief descriptions of technological features regarding afore-mentioned solar cell architectures are given in order to clarify the need for structuring processes. Further readings may be found easily for persons skilled in the art.

The concept of selective emitter solar cell makes usage from beneficial effects originating from the adjustment of different emitter doping levels. In principal conventionally manufactured solar cells require a need for comparably high emitter doping levels at this surface areas, where latter metallization contact will be formed in order to achieve good ohmic rather than Schottky-related metal contacts, and thus contact resistances. This may be achieved by low emitter sheet resistances (bearing a high content of dopant). On the other hand, relatively low doping levels (high sheet resistances) are requested for enhancing the spectral response of the solar cells as well as for improving minority carrier lifetimes within the emitter. Both needs basically rule out each other always requesting compromises between optimizing contact resistance at spectral responses cost and vice versa. With the implementation of a structuring process within process chain of device manufacturing, definition of regions of formation of regions bearing high and low sheet resistances will be easily accomplished by the aid of commonly known technology of masking (e.g. by $SiO_x$, $SiN_x$, $TiO_x$, etc.). Masking technology, however, presupposes possibilities of either structured mask deposition or the structuring of deposited masks, which refers to the present invention.

The concept of 'direct metallization' refers to the opportunity of a metallization process which will be carried out directly on for instance emitter-doped silicon. Nowadays, conventional creation of metal contacts is achieved by thick film technology, namely mainly by screen-printing, where a metal-containing paste is printed onto the ARC-capped silicon wafer surface. The contact is formed thermal treatment, namely a sintering process, within which the metal paste is forced to penetrate the front surface capping layer. Actually, front as well as rear surface metallization, or more precisely contact formations, are normally performed within one process step being called 'co-firing'. In particular the ability of contact formation at the front is mainly attributable to paste constituents (glass frits) which on the hand are essential, however, on the other hand lower the metal filling density of the paste, thus, besides other impacting factors, giving rise to lower conductivities than for instance contacts being deposited by electro-plating. Since front surfaces of solar cells manufactured conventionally lack of selectively opened windows for advanced front side metallization, paste sintering processes may not be omitted. Which in turn refers to the present invention: local opening of front side covering dielectric layers may be easily and versatile achieved, thus making 'direct metallization' approaches technological facile accessible. Those approaches may comprise topics like electroless deposition of metal seed layers forming metal silicides as primary contacts after annealing and being subsequently reinforced by electro-plating or such like printing metal pastes without glass frits into openings of structured dielectric layers.

The concept of local back surface field makes uses of benefit of enabling spots, stripes of other geometrical features of highly doped base contacts on the rear side being otherwise embedded in a semiconductor surface passivating layer like for instance $SiO_2$. The passivating layer is responsible for an appropriate surface capping while otherwise the surface would be able to act as charge carrier annihilator. Within this passivating layer, contact windows have to be generated in order to achieve traversing of charge carriers to exterior circuitry. Since such windows need to be connected to a (metal) conductor, however, on the other hand, metal contacts are known to be strongly recombination active (annihilation of charge carriers), as less as possible of the silicon surface should be metallized directly without on the other hand affecting the overall conductivity. It is known that contact areas in the range of 5% or below are sufficient for solar cell connection. In order to achieve good ohmic contacts rather than Schottky-related ones, doping level (sheet resistance) of base dopants below the contacts should be as high as possible. Additionally, increased doping levels of base dopants behave like an mirror (back surface field) for minority charge carriers, reflecting them from base contacts and thus significantly reducing recombination activity at either semiconductor surface or especially base metal contacts. In order to achieve a local back surface field, the passivating layer on top of the rear surface has to be opened locally, what in turn refers to the subject of present invention.

The concepts of PERC-, PERL- and PERT-solar cells do all comprise the individual above-depicted concepts of selective emitter, local back surface field as well as 'direct metallization'. All these concepts are merged together to architectures of solar cells being dedicated to achieve highest conversion efficiencies. The degree of merging of those sub-concepts may vary from type of cell to cell as well as from ratio of being able to be manufactured by industrial mass production. The same holds true for the concept of interdigitated back contact solar cells.

Bifacial solar cells are solar cells, which are able to collect light incidenting on both sides of the semiconductor. Such solar cells may be produced applying 'standard' solar cell concepts. Advances in performance gain will also make the usage of the concepts depicted above necessary.

The embodiment(s) described, and references in the specification to "one embodiment", "an embodiment", "an example embodiment", etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Overall, the method according to the present invention for etching substrates with inkjet printable inks as disclosed thus enables large numbers of pieces to be etched inexpensively in a suitable automated process on an industrial scale.

Even without any further explanations, it is assumed that a person skilled in the art can make use of the above description in its widest scope. The preferred embodiments and examples are therefore to be regarded merely as descriptive but in no way limiting disclosures.

For better understanding and for illustration, examples are given below which are within the scope of protection of the present invention. These examples also serve for the illustration of possible variants.

The complete disclosure of all applications, patents and publications mentioned above and below are incorporated by reference in the present application and shall serve in cases of doubt for clarification.

It goes without saying that, both in the examples given and also in the remainder of the description, the quoted percentage data of the components present in the compositions always add up to a total of 100% and not more. Given temperatures are measured in ° C.

EXAMPLES

Example 1

Thermal Evaporation of Volatile Basic Component

An ink comprising of 10 percent by weight of a mixture of (2 $Et_3N$:1 HF), 5 percent by weight PVP in water is inkjet printed onto the surface of a silicon nitride substrate, which is then heated to a temperature of 80° C., after evaporation of the water contained in the applied ink a thin film remains. On maintaining the temperature at 80° C. $Et_3N$ is released and removed by evaporation and etching takes place caused by the remaining HF. After 10 minutes the etching products are removed by rinsing with warm DI water (de-ionized water).

Example 2

Thermal Activation of Etchants

An ink, consisting of ethylene glycol, 40 percent by weight of water and 10 percent by weight of KF, is inkjet printed onto a silicon nitride coated silicon wafer. Heating of this patterned substrate to a temperature of 300° C. for 1 minute activates the comprising KF to etch the nitride surface. After this reaction the wafer is immersed in 0.1% KOH solution under irradiation with sonic waves for 5 minutes in order to remove etching products.

Example 3

Catalytic Release of Fluoride

An ink comprising of diethyleneglycol monoethylether, 10 percent by weight of toluenesulfonyl fluoride and 5 percent by weight of PVP is inkjet printed onto a nitride coated substrate at at a temperature of 100° C. (this elevated temperature will induce coffee staining, which will support the confining of the next ink, which is deposited onto the sulfonyl fluoride layer), a dry film of toluenesulfonylfluoride and PVP remains.

Next an ink containing the catalyst is deposited using the same pattern as used for the previous layer. This second ink comprises 10 percent by weight of potassium acetate and water. After this deposition the reaction is started and lasts for ten minutes whereby the substrate is heated to a temperature of 90° C. in order to accelerate the reaction. Afterwards the substrate is rinsed with DI water in order to remove the etching products and the remaining PVP.

Example 4

Printing Phosphoric Acid onto Films of PEG/KF

A thin film of fluoride is spin coated from a solution consisting of water, 20 percent by weight of PEG and 20 percent by weight of KF. The spin coating results in a film having a layer thickness of about 700 nm.

In a second inkjet printing step the next layer is applied onto this first layer. The second composition is an ink comprising of aqueous phosphoric acid (85%). Then the substrate is heated to a temperature of 90° C. for ten minutes. Afterwards the substrate is entirely submersed for 10 minutes in warm DI (de-ionized) water in order to remove the etching products and the excess of KF/PEG, which was not consumed in the etching reaction.

The invention claimed is:

1. An inkjetable composition comprising a complex consisting of an etchant and a second component rendering the etchant inert said complex being an uncharged salt selected from the group consisting of alkali metal fluorides, HF salts of amines, HF salts of polymeric amines, HF salts of polymers of nitrogen heterocycles, fluoroacetone, and mixtures thereof, and a proton generating compound selected from N-sulfonyloxyimides, oxime sulfonates, ammonium sulphonates, benzoin tosylate and 2-nitrobenzene tosylate, hydroxyarenes, 1-naphthol, 2-naphthol and diphenyliodonium fluoride, and wherein the composition is inkjetable.

2. The composition of claim 1 comprising a salt selected from the group of $NH_4F$, $(CH_3)_3NHF$, $(CH_3CH_2)_3NHF$, and (i-propylen)$_3$NHF.

3. The composition of claim 1 additionally comprising a fluoride containing compound selected from the group consisting of ammonium tetrafluoroborate, tetrafluoroboric acid, Selectafluor (1-Chloromethyl-4-fluoro-1,4-diazoniabicyclo[2.2.2]octane bis(tetrafluoroborate)) and organic acid fluorides and mixtures thereof.

4. The composition of claim 1 comprising a proton generating compound selected from the group consisting of the N-Sulfonyloxyimides, Oxime Sulfonates, ammonium sulphonates, benzoin tosylate and 2-nitrobenzene tosylate.

5. The composition of claim 1 wherein the proton generating compound is selected from the group consisting of 1-naphthol, 2-naphthol and diphenyliodonium fluoride.

6. The composition of claim 1, wherein the salt is provided in an amount of about 5 to about 25% by weight.

7. The composition of claim 6 additionally comprising a polyvalent alcohol in an amount of about 5 to about 15% by weight.

8. The composition of claim 7 wherein the polyvalent alcohol is glycerol, ethylene chlorohydrin, dioxane pinacol or a mixture thereof, or a mixture of water and polyethylene glycol, polymethylene glycol, ethylene glycol monomethyl ether.

9. The composition claim 8, wherein the salt is inert at an ambient temperature and generates its etching properties at elevated temperatures.

10. The composition of claim 1, wherein the salt is active in presence of a second composition comprising an activating agent or a proton donating compound.

11. The composition according to claim 8, wherein the salt is active in the presence of a composition comprising an acidic component selected from the group consisting of carboxylates, organic acids, mineral acids, or mixtures thereof.

12. The composition of claim 8, wherein the salt is active in presence of a composition comprising poly acids selected from the group consisting of polystyrene sulfonic acid, and poly acetic acid.

13. A method for the etching of a $SiO_2$ or $SiN_x$ layer which comprises applying a composition of claim 8 to the layer.

14. The composition of claim 1 wherein the salt is an HF salt of ammonia or a mono, di or trialkyl amine.

15. The composition of claim 1 wherein the salt is a fluoride of poly allylamine or poly vinylpyridine.

16. The composition of claim 2 wherein the fluoride containing compound is benzyl fluoride, an arylsulfonyl fluoride, or p-toluenesulfonyl fluoride.

17. The composition of claim 11 wherein the organic acid is acetic acid and the mineral acid is phosphoric acid.

18. The composition of claim 8, wherein the salt is active in presence of acids selected from the consisting group of organic acids, mineral acids or mixtures thereof.

19. The composition of claim 18 wherein the organic acid is acetic acid and the mineral acid is phosphoric acid.

20. The composition of claim 1, wherein the salt is fluoroacetone.

21. The composition of claim 1, wherein composition has a surface tension of 20 dyne/cm to 60 dyne/cm, is filtered to less than 1 micron, and has a viscosity of 2 cps to 20 cps at the jetting temperature wherein the jetting temperature is from room temperature to about 300° C.

* * * * *

UNITED STATES PATENT AND TRADEMARK OFFICE
CERTIFICATE OF CORRECTION

| | | |
|---|---|---|
| PATENT NO. | : 8,647,526 B2 | Page 1 of 1 |
| APPLICATION NO. | : 13/375812 | |
| DATED | : February 11, 2014 | |
| INVENTOR(S) | : Oliver Doll et al. | |

It is certified that error appears in the above-identified patent and that said Letters Patent is hereby corrected as shown below:

In the Claims:

Column 14, line 25 reads "wherein the composition is inkjetable", should read --wherein the composition has a viscosity of 2cPa to 20cPa--.

Signed and Sealed this
Twenty-first Day of October, 2014

Michelle K. Lee
*Deputy Director of the United States Patent and Trademark Office*